(12) United States Patent
Kawahara

(10) Patent No.: US 8,291,581 B2
(45) Date of Patent: Oct. 23, 2012

(54) METHOD FOR PRODUCTION OF SUBSTRATE ELECTRODE FOR PLASMA PROCESSING

(75) Inventor: Fimitomo Kawahara, Tokyo (JP)

(73) Assignees: Mitsui Engineering & Shipbuilding Co., Ltd., Tokyo (JP); ADMAP, Inc., Okayama (JP)

( * ) Notice: Subject to any disclaimer, the term of this patent is extended or adjusted under 35 U.S.C. 154(b) by 392 days.

(21) Appl. No.: 12/602,559

(22) PCT Filed: May 30, 2008

(86) PCT No.: PCT/JP2008/060043
§ 371 (c)(1),
(2), (4) Date: Dec. 1, 2009

(87) PCT Pub. No.: WO2008/146918
PCT Pub. Date: Dec. 4, 2008

(65) Prior Publication Data
US 2010/0212148 A1 Aug. 26, 2010

(30) Foreign Application Priority Data
Jun. 1, 2007 (JP) ................................. 2007-146782

(51) Int. Cl.
*H01R 43/00* (2006.01)
(52) U.S. Cl. ................ 29/825; 29/827; 29/830; 29/831; 29/832; 29/852
(58) Field of Classification Search .............. 29/825, 29/827, 830, 831, 832, 852; 439/66, 91, 439/74; 438/626, 645, 697; 156/290
See application file for complete search history.

(56) References Cited

U.S. PATENT DOCUMENTS

| | | | | |
|---|---|---|---|---|
| 5,442,143 A | * | 8/1995 | Schmidt et al. | 174/262 |
| 5,617,399 A | * | 4/1997 | Spruit et al. | 369/47.53 |
| 6,188,028 B1 | * | 2/2001 | Haba et al. | 174/266 |
| 2006/0141802 A1 | | 6/2006 | Shih et al. | |

FOREIGN PATENT DOCUMENTS

| | | |
|---|---|---|
| JP | 2003-059903 | 2/2003 |
| JP | 2005-285845 | * 10/2005 |

OTHER PUBLICATIONS

Japanese Office Action with English Translation.

* cited by examiner

*Primary Examiner* — Derris Banks
*Assistant Examiner* — Tai Nguyen
(74) *Attorney, Agent, or Firm* — Whitham Curtis & Christofferson & Cook, PC

(57) ABSTRACT

A plurality of reference holes are formed in the surface of a first substrate made of a first material, and a plurality of columnar members are each fitted in the reference holes in such a manner that at least a part of each of the columnar members projects from the surface of the first substrate. Subsequently, an electrode surface layer made of a second material is formed on the surface of the first substrate in such a manner that an end portion of each of the columnar members are exposed at the surface and then the columnar members are removed. Thus obtained is a substrate-like electrode including at least an electrode surface layer provided with through holes having a cross section matching a sectional shape of the projecting portion of the columnar members.

17 Claims, 8 Drawing Sheets

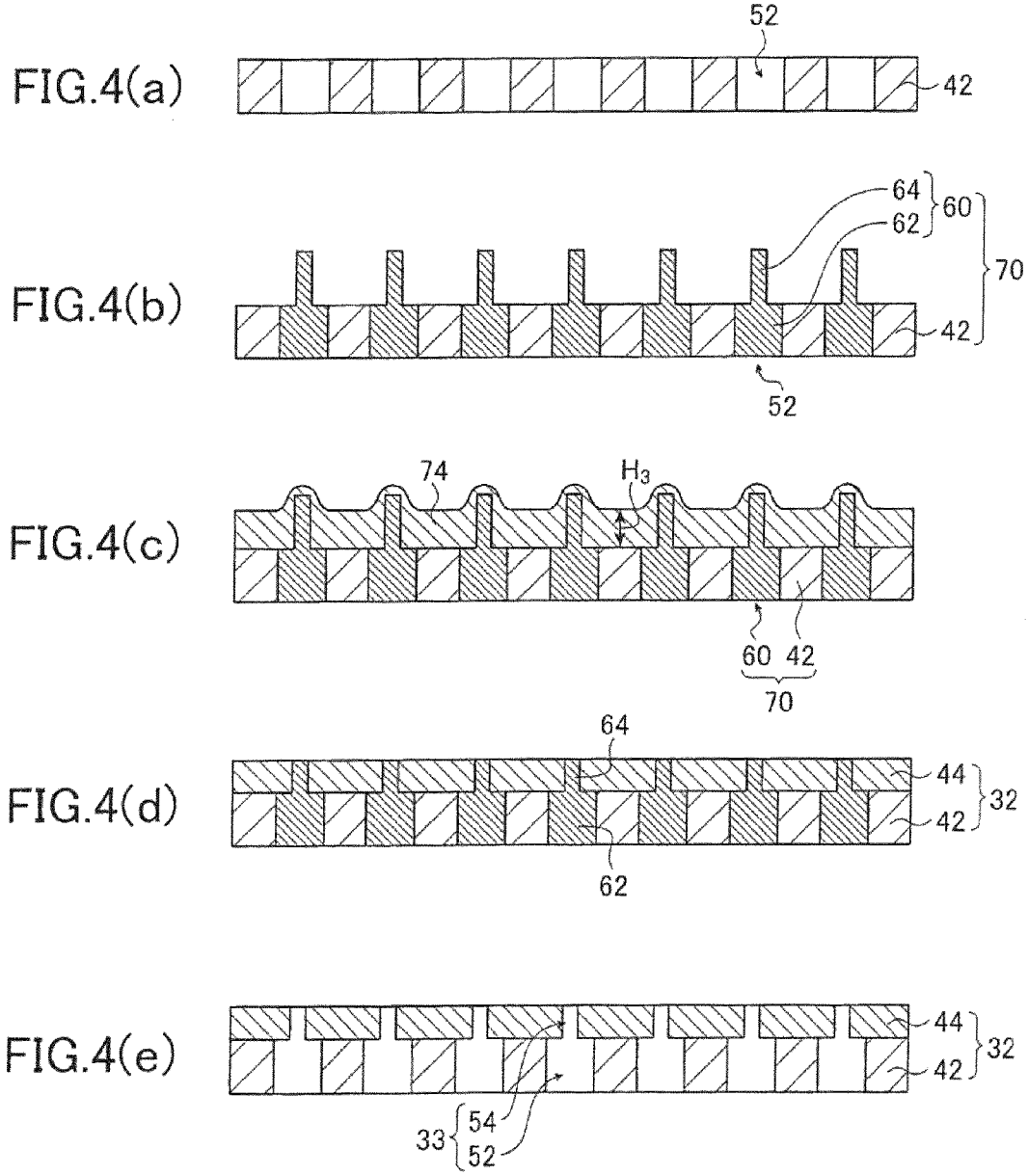

METHOD FOR PRODUCTION OF SUBSTRATE ELECTRODE FOR PLASMA PROCESSING

TECHNICAL FIELD

The present invention relates to a method of producing a substrate-like electrode provided with gas emission holes and installed in a plasma processing apparatus used, for example, in semiconductor manufacturing process to generate plasma in a plasma generation container by application of high frequency voltage and a method of restoring such an electrode.

BACKGROUND ART

In a plasma processing apparatus used for an etching step or a film formation step in the semiconductor manufacturing process, the electrodes to which high frequency voltage is applied to generate plasma in a plasma generation container are an important component. For example, in a typical plasma processing apparatus of a type provided with parallel flat electrodes, a high frequency voltage is applied between opposite electrodes disposed one above the other to generate plasma between the electrodes to perform plasma processing (etching and film formation) on a subject substrate placed between the electrodes. In a plasma processing apparatus provided with parallel flat electrodes, generally a wafer is placed on the lower electrode, and a reactive gas or an inactive gas is discharged through gas emission holes provided in the upper electrode. In other words, the electrode of a plasma processing apparatus serves also as a shower head for discharging gas and is provided with a plurality of gas emission holes piercing the substrate in its thickness direction.

In the parallel flat type plasma processing apparatus, at least a part of the electrode surfaces is exposed to generated plasma. In the step where the subject substrate undergoes etching, in particular, the electrode surfaces are subjected to corrosion (etching) as an active species of the reactive gas activated by plasma generated between the electrodes acts upon the electrode surfaces. When the electrode surfaces are corroded, the stability of the generated plasma decreases until finally generation of plasma becomes impossible.

Thus, the electrodes exposed to plasma in the plasma processing apparatus are consumables and there has been a demand for electrodes having a relatively high resistance to corrosion when exposed to plasma to ensure stable generation of plasma over an extended period of time and reduced running costs of the device. Thus, there have been proposed electrodes purporting to offer a relatively high resistance to corrosion when exposed to plasma, wherein at least the surface exposed to plasma is made of SiC (silicon carbide). SiC has a significantly high level of hardness and an excellent resistance to corrosion (to acid) and heat and is used not only as electric material but also as coating film material for components of semiconductors manufacturing apparatuses. SiC breaks down into sintered SiC produced by a so-called sintering method whereby pulverized SiC is sintered to obtain a relatively large structure and CVD-SiC produced by a chemical vapor deposition method.

However, SiC, when used to configure an electrode surface, considerably increases costs and time for forming through holes that serve as gas emission holes because of its mechanical strength. For example, to form through holes having a relatively small diameter of say 0.5 mm or less in a SiC material, one had no other alternative but to use a method such as ultrasonic machining that requires considerable costs and work. Thus, electrodes having a SiC surface were expensive to manufacture and also expensive to restore. Accordingly, use of SiC in the electrode surface did not aid in sufficiently reducing the running costs of the device.

The Patent Document 1 mentioned below describes an electrode for a plasma processing apparatus, wherein a porous SiC material containing numerous air holes communicating with each other and a CVD-SiC material formed with numerous through holes (gas emission holes) are stacked one on the other to form a unitary structure. The Patent Document 1 mentioned below also describes a method of manufacturing an electrode for a plasma processing apparatus, whereby, it is therein described, a CVD-SiC layer having, numerous through holes (gas emission holes) can be formed without machining the CVD-SiC material. According to the method of manufacturing an electrode for a plasma processing apparatus described in the Patent Document 1 mentioned below, a plurality of T-shaped pins each formed of a rod member and a flat plate that is joined to a part of the rod member are first disposed on one surface of a green sheet, which will be made into a porous SiC layer, with the flat plates embedded in the one surface, whereby the green sheet is allowed to undergo a sintering process to sinter it in an inert atmosphere to produce a porous SiC layer. Then, a CVD-SiC cover is formed using the CVD method on the surface of the porous SiC layer where the T-shaped pins are formed, and the surface of the CVD-SiC cover is polished to expose a part of each T-shaped pin, followed by heating in an oxidizing atmosphere for decomposition and removal of the T-shaped pins to achieve production of an electrode for a plasma processing apparatus having the above configuration.

Patent Document 1: JP 2003-59903 A

DISCLOSURE OF THE INVENTION

Problems to be Solved by the Invention

The electrode for a plasma processing apparatus described in the Patent Document 1 is configured by a porous SiC material and a CVD-SiC material formed with numerous through holes (gas emission holes) laid one over the other to form a unitary structure. The porous SiC material is such that SiC particles forming the porous SiC material are liable to detach. Therefore, where an electrode whose structure includes a porous SiC layer is used for plasma processing, there is a considerably increased chance of particles occurring as compared with the case using an electrode composed solely of a compact SiC material (e.g., a SiC material containing no air holes and composed solely of a sintered SiC material or a CVD-SiC material) (see paragraph [0017] of the Patent Document 1). From a viewpoint of preventing occurrence of particles, it is not preferable to use a porous SiC material in an electrode for a plasma processing apparatus.

Further, according to the method of manufacturing an electrode for a plasma processing apparatus described in the Patent Document 1, a plurality of T-shaped pins each formed of a rod member and a flat plate that is joined to a part of the rod member need to be disposed on one surface of a green sheet, which will be made into a porous SiC layer, with the flat plates embedded in the surface. According to the method of manufacturing an electrode for a plasma processing apparatus described in the Patent Document 1 mentioned below, the T-shaped pins cannot be disposed when the CVD-SiC layer has been reduced in thickness through exposure of the electrode surface layer to plasma. According to the method of manufacturing an electrode for a plasma processing apparatus described in the Patent Document 1 mentioned below, when the electrode surface layer has been corroded through exposure to plasma in the plasma processing apparatus, recovering (reproducing) the thickness of the corroded portion to restore the electrode to its original state by re-coating the electrode surface by a thickness corresponding to the thickness of the corroded portion required re-coating the surface by the CVD method to recover the thickness and then forming through holes (gas emission holes) in the CVD-SiC layer by mechanical machining, ultrasonic machining or the like. Thus, the method of manufacturing an electrode for a plasma processing apparatus described in the Patent Document 1 mentioned below incurred considerable costs for restoration of the electrode and incurred relatively high running costs in the long term.

The present invention has been made in view of these problems and its object is to provide a method of producing an electrode for a plasma processing apparatus and a method of restoring the electrode, the electrode being capable of sufficiently preventing occurrence of particles during plasma processing and permitting sufficient reduction of the running costs of the plasma processing apparatus.

Means to Solve the Problems

In order to attain the object described above, the present invention provides a method of producing a substrate-like electrode for a plasma processing apparatus, the substrate-like electrode being provided with gas emission holes and installed in a plasma processing apparatus used to generate plasma in a plasma generation container by application of high frequency voltage, comprising: a step of forming reference holes in a surface of a first substrate made of a first material; a step of fitting columnar members in the reference holes, respectively, and disposing the columnar members in the first substrate in such a manner that at least a part of each of the columnar members projects from the surface of the first substrate; a step of forming an electrode surface layer made of a second material on the surface of the first substrate in such a manner that an end portion of each of the columnar members is exposed at a surface thereof; and a step of removing at least the columnar members to obtain, as the substrate-like electrode, a substrate provided with first through holes each having a cross section matching a sectional shape of a projecting portion of each of the columnar members in the electrode surface layer.

In this case, it is preferable that the columnar members each have a base portion and a convex portion and the base portion have a sectional shape substantially matching a sectional shape of the reference holes, and the convex portion be the projecting portion projecting from the surface of the first substrate when disposed in the first substrate and have a sectional area smaller than a sectional area of the base portion.

It is preferable that the step of forming the electrode surface layer comprise coating using the second material so as to entirely cover the projecting portion of the columnar members projecting from the surface of the first substrate and thereafter machining a surface of the second material to expose the end portions of the columnar members to form the electrode surface layer.

It is preferable that the reference holes be through holes piercing the first substrate, the substrate-like electrode have a configuration comprising the first substrate including the reference holes and the electrode surface layer formed with the first through holes, the gas emission holes provided in the substrate-like electrode be holes formed by the reference holes communicating with the first through holes, and the step of obtaining the substrate-like electrode comprise removing only the columnar members to obtain the substrate-like electrode.

In that case, it is preferable that the step of forming the electrode surface layer comprise performing a CVD film formation step on the surface of the first substrate to form a layer made of CVD-SiC as the electrode surface layer. It is preferable that the first material be sintered SiC. It is preferable that the columnar members be made of graphite or carbon. It is preferable that the when removing the columnar members, the columnar members be oxidized by heating in an atmosphere containing oxygen to decompose and remove the columnar members.

Or, it is preferable that the substrate-like electrode be composed solely of the electrode surface layer, and the step of obtaining the substrate-like electrode comprise removing the first substrate together with the columnar members to obtain the substrate-like electrode.

In that case, it is preferable that the step of forming the electrode surface layer comprise performing a CVD film formation step on the surface of the first substrate to form a layer made of CVD-SiC as the electrode surface layer. It is preferable that the first substrate and the columnar members be both made of graphite or carbon. It is preferable that when removing the columnar members, the first substrate and the columnar members be oxidized by heating in an atmosphere containing oxygen to decompose and remove the first substrate and the columnar members.

Furthermore, it is preferable that a cross section of the base portion smoothly connect to a cross section of the convex portion of the columnar members without forming any step between them.

Furthermore, the present invention provides a method of restoring a worn substrate-like electrode provided with gas emission holes and having a thickness reduced through use for generation of plasma in a plasma generation container, wherein the substrate-like electrode is produced by a production method comprising: a step of forming reference holes in a surface of a first substrate made of a first material; a step of fitting columnar members in the reference holes, respectively, and disposing the columnar members in the first substrate in such a manner that at least a part of each of the columnar members projects from the surface of the first substrate; a step of forming an electrode surface layer made of a second material on the surface of the first substrate in such a manner that an end portion of each of the columnar members are exposed at a surface thereof; and a step of removing at least the columnar members to obtain, as the substrate-like electrode, a substrate provided with first through holes each having a cross section matching a sectional shape of a projecting portion of each of the columnar members in the electrode surface layer, and wherein, when restoring the worn substrate-like electrode, the restoring method comprises: a step of fitting the columnar members in the reference holes or the first through holes of the substrate-like electrode or both; a step of coating the surface of the electrode surface layer of the substrate-like electrode fitted with the columnar members with the second material to increase a thickness of the electrode surface layer; and a step of removing at least the fitted columnar members.

In this case, it is preferable that the substrate-like electrode produced by the production method have a configuration comprising the first substrate including the reference holes and the electrode surface layer formed with the first through holes, and, when the columnar members are fitted in the reference holes and the first through holes and the columnar members are removed to restore the substrate-like electrode, the columnar members are removed and the first substrate and the electrode surface layer are allowed to remain.

Or, it is preferable that the substrate-like electrode produced by the production method is configured by the electrode surface layer formed with the first through holes, and wherein, when restoring the substrate-like electrode, the restoring method comprises: preparing a second substrate having the same configuration as the first substrate comprising the reference holes; fitting the columnar members in the reference holes of the substrate and the first through holes of the substrate-like electrode; and removing the columnar members and the second substrate.

More, the present invention provides a method of restoring a worn substrate-like electrode provided with gas emission holes and having a thickness reduced through use for generation of plasma in a plasma generation container, wherein the reference electrode is produced by a production method comprising: a step of forming reference holes in a surface of a first substrate made of a first material; a step of fitting columnar members in the reference holes, respectively, and disposing the columnar members in the first substrate in such a manner that at least a part of each of the columnar members projects from the surface of the first substrate; a step of forming an electrode surface layer made of a second material on the surface of the first substrate in such a manner that an end portion of each of the columnar members are exposed at a surface thereof; and a step of removing at least the columnar members to obtain, as the substrate-like electrode, a substrate provided with first through holes each having a cross section matching a sectional shape of a projecting portion of each of the columnar members in the electrode surface layer, and wherein, when restoring the worn substrate-like electrode, the restoring method comprises: a step of forming a mask layer on one surface of the substrate-like electrode to close openings of the reference holes of the substrate-like electrode; a step of coating another surface of the electrode surface layer of the substrate-like electrode formed with the mask layer with the second material to increase a thickness of the electrode surface layer; and a step of removing the mask layer and forming the reference holes in a portion by which the electrode surface layer has increased using the reference holes left in the one surface after increasing the thickness of the electrode surface layer.

Effects of the Invention

Use of the inventive method of producing an electrode for a plasma processing apparatus permits producing an electrode for a plasma processing apparatus comprising a plurality of gas emission holes and capable of sufficiently preventing occurrence of particles during plasma processing at sufficiently low costs. The electrode for a plasma processing apparatus produced according to the production method of the invention has a sufficiently high resistance to corrosion in the case where the electrode is exposed to plasma, and ensures stable generation of plasma over an extended period of time. Further, even in the case of a substrate for a plasma processing apparatus that is worn as the electrode surface has been corroded by plasma and the thickness has been reduced, the use of the inventive method of restoring an electrode for a plasma processing apparatus permits restoration of the above substrate to its original thickness at a relatively low cost, while preserving the configuration provided with a plurality of gas emission holes. Therefore, use of the production method of the invention permits sufficiently reducing the long-term running costs of the plasma processing apparatus.

BRIEF DESCRIPTION OF THE DRAWINGS

FIGS. 4(a) to 4(e) These are views for explaining an example of the method of producing an electrode for a plasma processing apparatus according to the invention.

Figure 1:
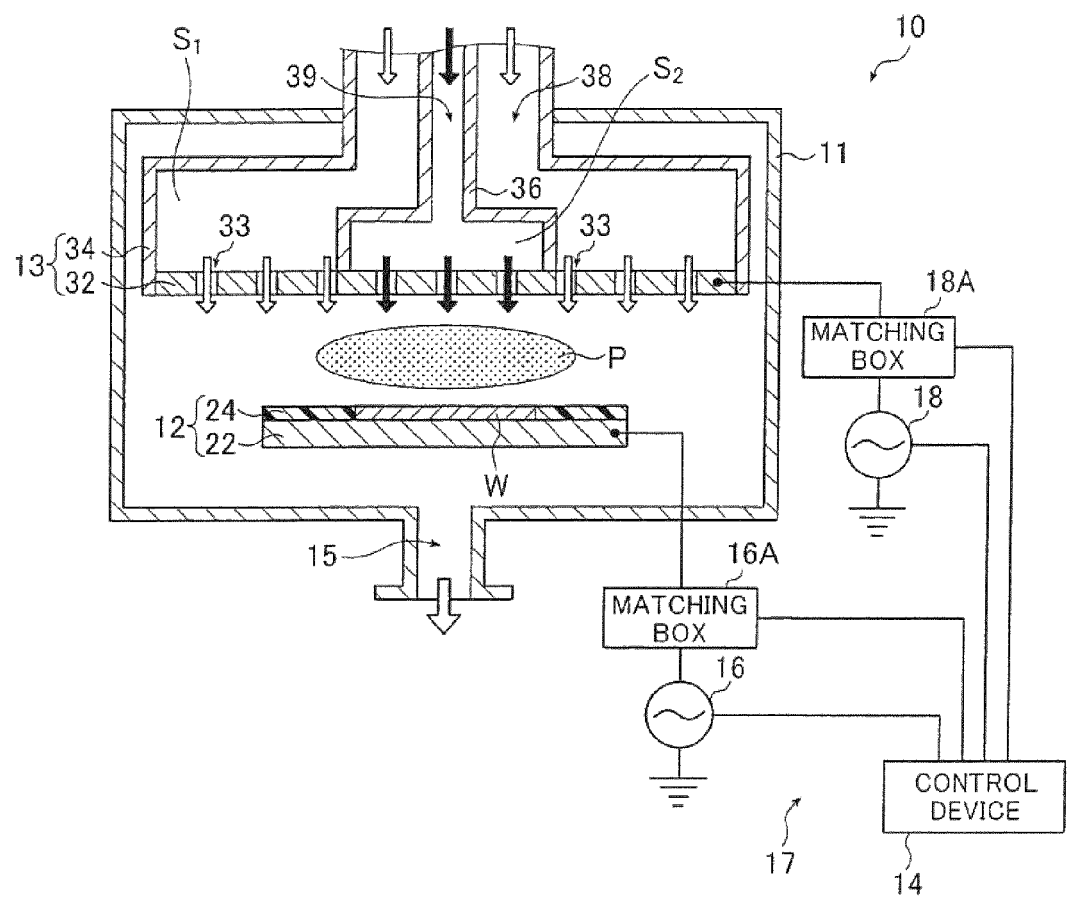
FIG. 1 This is a schematic sectional view for explaining an example of a plasma processing apparatus using an electrode for a plasma processing apparatus produced according to the inventive method of producing an electrode for a plasma processing apparatus.

LEGEND 10 plasma processing apparatus
11 processing chamber
12 lower electrode structure
13 upper electrode structure
14 control device
15 discharge outlet
16, 16A first high frequency power source, first matching box
18, 18A second high frequency power source
17 power source
22 lower electrode
24 focus ring
32 upper electrode
33 gas emission hole
34 outer diffusion chamber member
36 inner diffusion chamber member
38 outer supply duct
39 inner supply duct
42 base layer
44 electrode surface layer
52 reference hole
54 through hole
60 columnar member
62 base portion
64 convex portion
70 first assembly
74 cover layer 80, 96 used electrode substrates
90 base substrate
92 through hole
94 graphite assembly
96 used electrode substrate
98 mask layer

BEST MODE FOR CARRYING OUT THE
INVENTION

Now, the method of producing an electrode for a plasma processing apparatus according to the invention will be described below. FIG. 1 is a cross section for explaining an embodiment of a plasma processing apparatus. The plasma processing apparatus illustrated in FIG. 1 is configured using an embodiment of the electrode for a plasma processing apparatus fabricated using the method of producing an electrode for a plasma processing apparatus according to the invention.

A plasma processing apparatus 10 illustrated in FIG. 1 is a so-called double-frequency excitation capacitive-coupled plasma processing apparatus whereby high frequency voltages having different frequencies are applied to two opposite flat plate electrodes respectively to control plasma generation and the energy of incoming ions independently.

The plasma processing apparatus 10 according to this embodiment comprises a processing chamber 11 formed of a conductive material such as aluminum and a power source unit 17, as illustrated in FIG. 1. In the processing chamber 11, there is disposed a lower electrode mechanism 12 and an upper electrode mechanism 13. The power supply unit 17 comprises a first high frequency power source 16, a first matching box 16A, a second high frequency power source 18, a second matching box 18A, and a control device 14.

The lower electrode mechanism 12 comprises a lower electrode 22 for bearing thereon a wafer W, which is an object to be processed, and a focus ring 24 provided on the outer periphery of the top surface of the lower electrode 22 so as to surround the outer periphery of the wafer W. The lower electrode 22 is connected with the first high frequency power source 16 through the matching box 16A. A high frequency voltage is applied to the lower electrode 22 from the high frequency power source 16 through the matching box 16A. The focus ring 24 is a known focus ring for correcting unevenness in plasma processing speed between a portion closer to the center and a portion closer to the edge of the wafer W. The lower electrode mechanism 12 has therein incorporated a cooling system and a heating system, not shown, for adjusting the wafer W to a given temperature. Further, the lower electrode 22 is moved vertically via a lifter, not shown, to set an appropriate gap between the wafer W and the upper electrode according to the kind of plasma processing to be performed.

The upper electrode mechanism 13 comprises an upper electrode 32, an outer diffusion chamber member 34, and an inner diffusion chamber member 36. The upper electrode 32 is connected with the second high frequency power source 18 through the matching box 18A. A high frequency voltage is applied to the upper electrode 32 from the high frequency power source 18 through the matching box 18A. The outer diffusion chamber structure 34 is a structure in the form of a housing having an opening on the bottom side thereof; the upper electrode 32 is so disposed as to close the opening. The inner diffusion chamber structure 36 is a structure in the form of a housing provided inside the outer diffusion chamber structure 34; the opening formed on the bottom side thereof is so disposed as to be closed by the upper electrode 32. The outer diffusion chamber member 34 is supplied with a first gas through an outer supply duct 38 connected to a gas supply device, not shown, configured by a gas cylinder, a mass flow controller, etc., not shown. The inner diffusion chamber member 36 is supplied with a second gas through an inner supply duct 39 connected to a gas supply device, also not shown. A space $S_1$ defined by the outer supply duct 38 and the outer diffusion chamber member 34 and a space $S_2$ defined by the inner supply duct 39 and the inner diffusion chamber member 36 are spatially separate from each other so that the first gas and the second gas do not mix in the supply ducts and the diffusion chambers.

Figure 2:
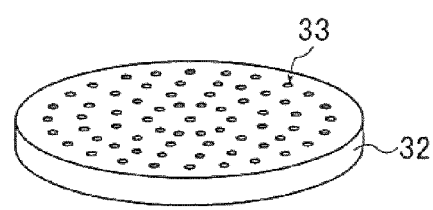
FIG. 2 This is a schematic perspective view of an upper electrode of the plasma processing apparatus illustrated in FIG. 1.

FIG. 2 is a schematic perspective view of the upper electrode 32. The upper electrode 32 is a discoid member and has gas emission holes 33 piercing it from its top surface through its bottom surface. The shape of the surface of the electrode substrate fabricated according to the invention is not limited specifically. The first gas supplied into the space $S_1$ is supplied through those of the gas emission holes 33 that are provided relatively closer to the outer periphery of the upper electrode 32 to a plasma generation region P between the upper electrode 32 and the lower electrode 22. The second gas supplied into the space $S_2$ is supplied through those of the gas emission holes 33 that are provided relatively closer to the center of the upper electrode 32 into a plasma generation region P. In the plasma processing apparatus 10, the first gas and the second gas are thus separately supplied to the plasma generation region P through the gas emission holes 33 respectively located in the different regions of the upper electrode 32. Supplying a plurality of gases used for plasma processing separately through the gas emission holes formed in the different regions of the substrate-like electrode prevents, for example, gas phase reaction of the gases on their way to the plasma generation region P, which would generate unnecessary particles.

The processing chamber 11 is formed at its bottom with a discharge outlet 15 for discharging gases, etc. from the processing chamber 11 through a discharge device, not shown, such as a rotary pump, turbo-molecular pump, or the like connected to the discharge outlet 15. The processing chamber 11 is provided with a pressure gage, not shown, for measuring the pressure inside the processing chamber 11.

The control device 14 controls the entire plasma processing operations performed by the plasma processing apparatus 10. In addition to the first high frequency power source 16, the first matching box 16A, the second high frequency power source 18, and the second matching box 18A, the control device 14 is connected also to the gas supply device, the discharge device, the pressure gauge, etc. mentioned above to control the atmosphere inside the processing chamber 11 to a given pressure of processing gas atmosphere. The control device 14, maintaining the processing gas atmosphere inside the processing chamber 11 controlled to a given pressure, causes the first high frequency power source 14 to apply say 2-MHz first high frequency electricity to the lower electrode 12 and simultaneously causes the second high frequency power source 15 to apply say 60-MHz second high frequency electricity to the upper electrode 13. Thus, when high frequency electricity is applied, the second high frequency electricity causes plasma, which is the processing gas, to be produced in a region between the lower electrode 22 and the upper electrode 32. Along with the production of the plasma P, a self-bias voltage is produced at the lower electrode 22 by the first high frequency electricity. Thus, the wafer W on the lower electrode 22 is subjected to plasma processing such as, for example, reactive ion etching and CVD film formation.

In recent years, there has been proposed a plasma processing apparatus, like the device 10 illustrated in FIG. 1, wherein different kinds of gases are supplied separately from different regions of an electrode surface to a plasma generation region. In order to supply different kinds of gases independently from different regions of an electrode surface to a plasma generation region, a substrate-like electrode needs to be provided with a plurality of gas emission holes piercing it from the top surface of the electrode through the bottom surface thereof. When, for example, one layer of the two-layer electrode does not have through holes and is formed of porous material made of SiC, like the electrode for a plasma processing apparatus described in the above Patent Document 1, different gases become mixed inside the porous SiC layer. The electrodes for plasma processing apparatuses described in the above Patent Document 1 cannot be used for a plasma processing apparatus, wherein different kinds of gases are supplied independently from different regions of an electrode surface to a plasma generation region. The method of producing an electrode for a plasma processing apparatus according to the invention is a method for producing an electrode for a plasma processing apparatus wherein the electrode has a plurality of gas emission holes piercing it from one substrate surface through the other substrate surface. According to this production method, the present invention provides an electrode for a plasma processing apparatus comprising a plurality of gas emission holes and capable of sufficiently preventing occurrence of particles during plasma processing and sufficiently reducing the running costs.

Figure 3A:
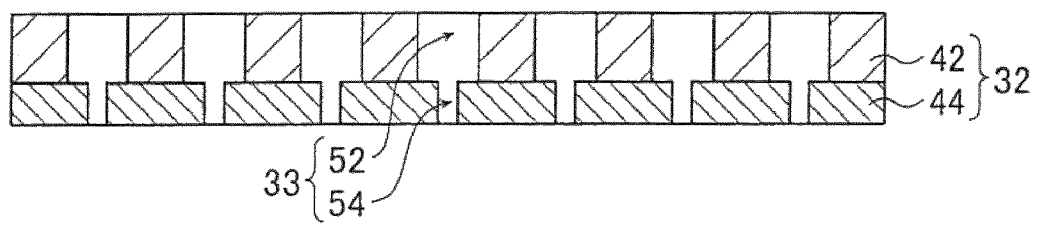
FIGS. 3(a) and 3(b) These are schematic sectional views for explaining the configuration of the upper electrode illustrated in FIGS. 1 and 2.
Figure 3B:
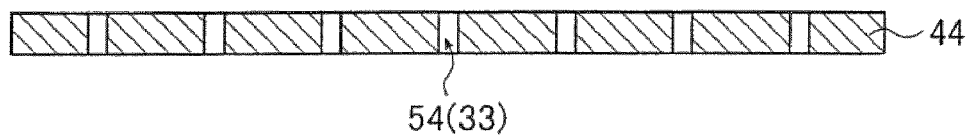

FIGS. 3(a) and 3(b) are schematic cross sections for explaining the configuration of the upper electrode 32 illustrated in FIGS. 1 and 2; FIGS. 3(a) and 3(b) illustrate different embodiments. In the drawings referred to below, components having like structure and functions because of like shapes and materials share like characters. In the example illustrated in FIG. 3(a), the upper electrode 32 has a two-layer structure comprising an electrode surface layer 44 made of CVD-SiC provided on a base layer (a first substrate) 42 made of sintered SiC. The example illustrated in FIG. 3(a) has a configuration comprising a plurality of gas emission holes 33 formed by reference holes 52 provided in the base layer 42 and small-diameter through holes (second through holes) 54 provided in the electrode surface layer 44, the reference holes 52 communicating with the second through holes 54. In the example illustrated in FIG. 3B, on the other hand, the upper electrode 32 has a one-layer structure comprising only the electrode surface layer 44 made of CVD-SiC. In both examples illustrated in FIGS. 3(a) and 3(b), the surface on the side exposed to plasma is made of CVD-SiC and, therefore, corrosion of the electrode surface caused by plasma is relatively of minor importance. Thus, stable generation of plasma can be ensured for a long period of time. Both examples illustrated in FIGS. 3(a) and 3(b) are provided with a plurality of gas emission holes 33 piercing the electrode from its top surface through its bottom surface. Both of the electrodes for a plasma processing apparatus illustrated in FIGS. 3(a) and 3(b) can be used suitably in a plasma processing apparatus wherein different kinds of gases are supplied separately to the plasma generation region.

Now, the method of producing an electrode for a plasma processing apparatus according to the invention will be described in detail below. FIGS. 4(a) to 4(e) are views for explaining an example of the method of producing an electrode for a plasma processing apparatus according to the invention and illustrate an example whereby the upper electrode 32 illustrated in FIG. 3(a) is produced.

First, a plurality of reference holes 52 are formed in the surface of the base layer 42, which is a substrate made of sintered SiC (FIG. 4(a)). The base layer 42 is a sintered SiC substrate having a thickness of say 10 mm. A plurality of through holes (reference holes 52) having a diameter of say 0.8 mm are formed by machining in given positions of the base layer 42. According to this embodiment, reference holes 52 each have a circular cross section. The machining may be effected using any of known machining methods including mechanical drilling, ultrasonic machining, and laser machining. Sintered SiC has lower physical and chemical strengths than CVD-SiC. To form a number of through holes each having an extremely small diameter, say 0.5 mm or less, at a time, mechanical machining would require much work and reduce machining accuracies by producing, for example, an error in diameter. One could use a method capable of higher accuracies than mechanical machining such as ultrasonic machining but manufacturing costs would increase. However, if the hole diameter is about 0.8 mm, a plurality of through holes (reference holes) can be formed in a sintered SiC material in a large number at a time without requiring much work and costs.

Figure 5A:
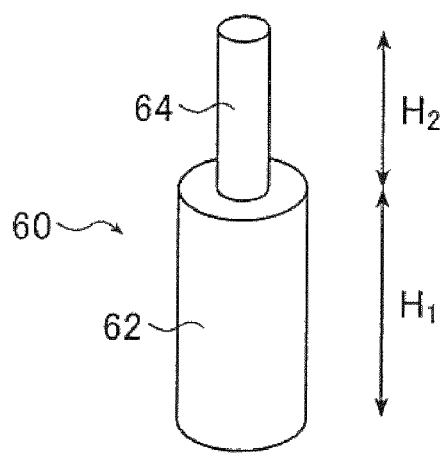
FIGS. 5(a) and 5(b) These are schematic perspective views of columnar members.
Figure 5B:
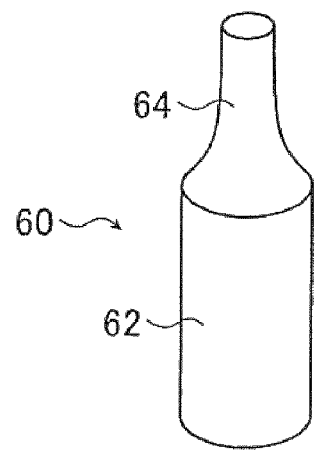

Next, a plurality of columnar members 60 made of graphite are disposed in the reference holes 52 of the base layer 42 (FIG. 4B). FIGS. 5(a) and 5(b) are schematic perspectives of columnar members 60; FIGS. 5(a) and 5(b) illustrate different embodiments thereof. Referring to FIG. 5(a), first, the columnar member 60 comprises a base portion 62 having a sectional shape substantially identical to the sectional shape of each reference hole 52 and a convex portion 64 having a sectional area smaller than the sectional area of the base portion 62. The sectional shape of the base portion 62, corresponding to that of each reference hole 52 of the base layer 42, has a circular shape with a diameter of about 0.8 mm. According to the present invention, the base portion 62 and the convex portion 64 of the columnar member 60 is not limited to a circle. A height $H_1$ of the base portion 62 corresponds to the thickness of the base layer 42; $H_1$ is about 10 mm. The sectional shape of the convex portion 64 of the columnar member 60 is a circle having a diameter of 0.5 mm. A height $H_2$ of the convex portion 64 is say about 5.0 mm. The height $H_2$ of the convex portion 64 is not less than a set film thickness of the electrode surface layer (layer formed of a CVD-SiC layer) in the upper electrode as finally formed (as will be described later, the set film thickness of the electrode surface layer 44 as finally formed is 4.0 mm). Using graphite, which has a low level of hardness and permits easy machining, a columnar convex portion in the form of a cylinder having a sectional shape with a diameter of about 0.5 mm can be produced with a high form accuracy and at a relatively low cost. Further, use of a material such as graphite that has a low level of hardness and permits easy machining will enable formation of a columnar member having a convex portion with a sectional shape as small as say 0.1 mm.

In the example illustrated in FIG. 5B, the convex portion 64 increases in cross section as it approaches the base portion 62 in such a manner that the lateral periphery of the base portion 62 smoothly communicates with the lateral periphery of the convex portion 64 without forming any step between them. The lateral periphery of the convex portion 64 may be described as having a streamlined shape. By way of example, the columnar members 60 illustrated in FIGS. 4 to 8 described later have the shape shown in FIG. 5(a). Whether the columnar members 60 has the shape shown in FIG. 5(a) or FIG. 5(b), there is no specific difference in the processes illustrated in these drawings. The effects produced specifically by the lateral periphery of the convex portion 64 of the columnar member 60 having a streamlined shape as illustrated in FIG. 5B will be described later.

The columnar members 60 are disposed in the base layer 42 with the base portions 62 of the columnar members 60 fitted in the reference holes 52. With the columnar members 60 thus disposed, a first assembly 70 is configured where the convex portions 64 of the columnar members 60 project from the surface of the base layer 42. Where necessary, an adhesive or a known hardening resin may be used to secure the base portions 62 of the columnar members 60 to the reference holes 52.

Next, the first assembly 70 having the convex portions 64, now projecting, is introduced into a known CVD device to form a cover layer 74 made of CVD-SiC over the surface of the first assembly 70. The CVD method provides a preferable step coverage on the relief surface of the substrate to be filmed. The cover layer 74 covers the whole surface of the first assembly 70 including the convex portions 64 projecting from the surface of the base layer 42 (FIG. 4C). The cover layer 74 is formed so that the film thickness of the cover layer 74 from the surface of the base layer 42 to the surface of the cover layer 74 is not less than a set film thickness of the electrode surface layer (layer formed of a CVD-SiC layer) of the upper electrode as finally formed. In this embodiment, the cover layer 74 is formed so that a film thickness $H_3$ from the surface of the base layer 42 to the surface of the cover layer 74 is in a range of 4.0 mm to 4.5 mm.

Next, the cover layer 74 placed over the surface of the first assembly 70 is planarized. The planarization reduces the thickness of the cover layer 74 to the set film thickness of the electrode surface layer (formed of a CVD-SiC layer) of the upper electrode as finally formed to form the electrode surface layer 44 made of a CVD-SiC layer with the top end of the convex portions 64 exposed at the surface (FIG. 4D). In this embodiment, the set film thickness of the electrode surface layer 44 as finally formed is 4.0 mm, and the cover layer 74 is planarized to this set film thickness. The planarization may be carried out using any of known methods including mechanical polishing.

Next, the first assembly 70 formed with the electrode surface layer 44 is disposed in an oxidizing atmosphere for heating to decompose and remove the graphite columnar members 60 by oxidation (FIG. 4E). For example, the first assembly 70 having the electrode surface layer 44 formed thereon is disposed in a heating furnace supplied with oxygen and heated to a high temperature of say 1000° C. Thus obtained is the upper electrode 32 in the form of a two-layer substrate wherein the electrode surface layer 44 made of CVD-SiC is provided on the surface of the base layer 42 made of sintered SiC. The upper electrode 32 produced through the above steps comprises also the gas emission holes 33 formed by the reference holes 52 and the small-diameter through holes 54 communicating with each other.

Needless to say, the small-diameter through hole 54 is a through hole having a shape matching the convex portion 64 of the columnar member 60 and has a diameter of 0.5 mm. CVD-SiC has such a high mechanical strength that forming therein a hole having a small diameter as mentioned above requires a special machining method such as ultrasonic machining and thus required considerable work and costs. The method of producing an electrode substrate for a plasma processing apparatus according to the present invention enables formation of through holes having a small diameter of say 0.5 mm even in an electrode surface layer made of a material having a relatively high mechanical strength such as CVD-SiC at relatively low costs. Further, graphite, having a low level of hardness, permits easy machining and allows formation of a columnar member having a convex portion with a sectional shape as small as say 0.1 mm. Thus, using the method of producing an electrode for a plasma processing apparatus according to the present invention enables formation of an electrode surface layer formed of a CVD-SiC layer provided with gas supply holes having such a small diameter, say 0.1 mm, that cannot be achieved by mechanical machining or ultrasonic machining.

Further, where the lateral periphery of the convex portion 64 of the columnar member 60 has a streamlined shape as illustrated in FIG. 5B, generation of turbulence can be prevented from occurring in the flow of gas flowing from the reference hole 52 through the small-diameter through hole 54. To improve the control of the gas flow during plasma processing in the plasma processing apparatus, the lateral periphery of the convex portion of the columnar member has a streamlined shape as illustrated in FIG. 5B. However, in terms of costs for machining graphite, the shape illustrated in FIG. 5(*a*) has an advantage (entails less costs) over the shape illustrated in FIG. 5B. The shape of the columnar member 60 may be determined as appropriate by taking account of various requirements including the gas control required in plasma processing and the costs for operating and maintaining the device.

Using the method of producing an electrode for a plasma processing apparatus according to the present invention, an electrode, of which the substrate has a reduced thickness because the surface was eroded by plasma, can be restored to its original state at relatively low costs. Specifically, the thickness of the electrode surface layer of an electrode, of which the substrate has a reduced thickness because the surface was corroded by plasma, can be restored to the original thickness at relatively low costs.

FIGS. 6(*a*) to 6(*e*) are views for explaining a method of restoring an electrode for a plasma processing apparatus using the method of producing an electrode for a plasma processing apparatus according to the invention. The processing illustrated in FIGS. 6(*a*) to 6(*e*) recovers the thickness of an electrode surface layer 44 of a used electrode substrate 80, of which the thickness of the electrode surface layer 44 has been reduced as compared with when the electrode was first installed in a plasma processing apparatus through its use for generation of plasma in the plasma processing apparatus after the electrode was previously installed in the plasma processing apparatus, to its original thickness. The used electrode substrate 80 subjected to the processing illustrated in FIGS. 6(*a*) to 6(*e*) is a two-layer upper electrode produced by the method illustrated in FIGS. 4(*a*) to 4(*e*); the thickness of its surface electrode layer has been reduced as compared with when the electrode was manufactured through exposure to plasma after the electrode was previously installed in the device 10. For example, the thickness of the electrode surface layer, which measured 4.0 mm at the time of manufacture (at the time of installation in the device 10), has decreased to say 3.0 mm through repeated exposure to plasma.

First, the above columnar members 60 made of graphite are fitted and disposed in the gas emission holes 33 provided in the used electrode substrate 80 as illustrated in FIG. 6(*a*) (FIG. 6(*b*)). Each gas emission hole 33 formed of the reference hole 52 and the small-diameter through hole 54 is fabricated using the columnar member 60; the small-diameter through hole 54, in particular, has a shape matching the columnar member 60. The above columnar member 60 made of graphite can be easily fitted and disposed in the gas emission holes 33 provided in the used electrode substrate 80.

Next, the substrate in this state is introduced into a known CVD device to form the cover layer 74 made of CVD-SiC over the surface of the electrode surface layer 44 of which the thickness has decreased. As in the case illustrated in FIG. 4C, the cover layer 74 is formed so that the film thickness of the portion corresponding to the surface of the base layer 42 is not less than the set film thickness of the electrode surface layer (layer formed of a CVD-SiC layer) of the upper electrode as finally formed.

Figure 6A:
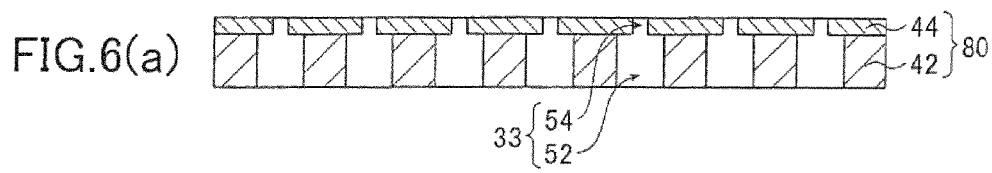
FIGS. 6(a) to 6(e) These are views for explaining an example of a method of restoring an electrode for a plasma processing apparatus using the method of producing an electrode for a plasma processing apparatus according to the invention.
Figure 6B:
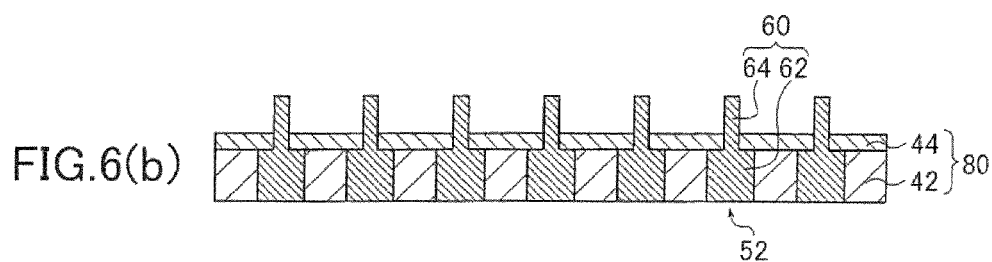
Figure 6C:
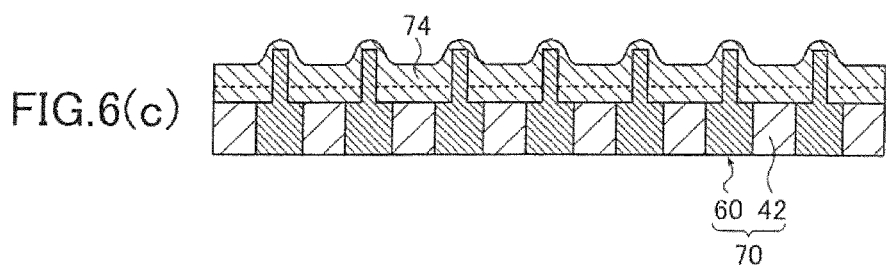
Figure 6D:
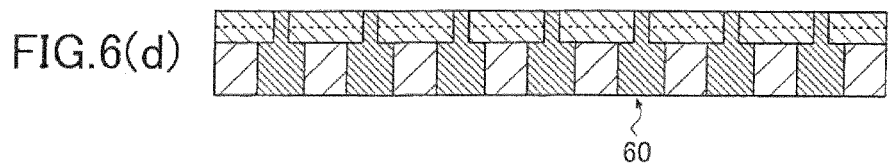
Figure 6E:
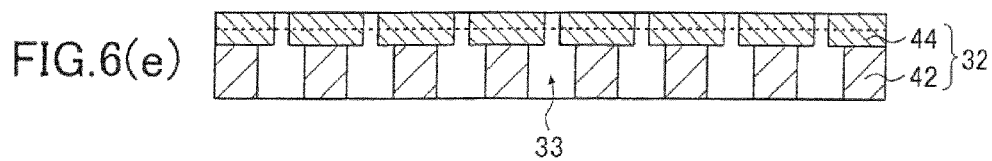

As illustrated in FIG. 6D, the cover layer 74 thus formed is planarized using the same method as in FIG. 4D to reduce the thickness of the cover layer 74 to the set film thickness of the electrode surface layer (formed of a CVD-SiC layer) of the upper electrode as finally formed to expose the top end of the convex portions 64 at the surface. Then, the columnar members 60 made of graphite are decomposed and removed by disposing them in an oxidizing atmosphere for heating as illustrated in FIG. 6E. Use of the production method illustrated in FIGS. 6(a) to 6(e) permits recovering the thickness of an electrode surface layer 44 of a used electrode substrate 80, of which the thickness of the electrode surface layer 44 has been reduced as compared with when the electrode was installed in a plasma processing apparatus through its use for generation of plasma in the plasma processing apparatus after the electrode was previously installed in the plasma processing apparatus, to its original thickness.

Next, another embodiment of the method of producing an electrode for a plasma processing apparatus according to the invention will be described. Detailed description will be made. FIGS. 7(a) to 7(e) are views for explaining an example of the method of producing an electrode for a plasma processing apparatus according to the invention and illustrate an example wherein the upper electrode 32 according to the embodiment illustrated in FIG. 3B is produced.

Figure 7A:
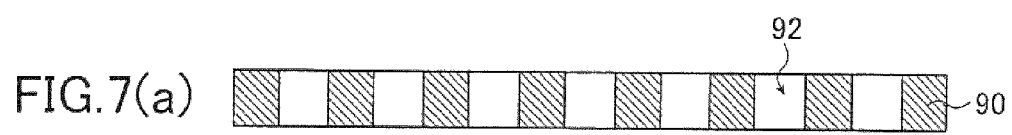
FIGS. 7(a) to 7(e) These are views for explaining an example of the method of producing an electrode for a plasma processing apparatus according to the invention.
Figure 7B:
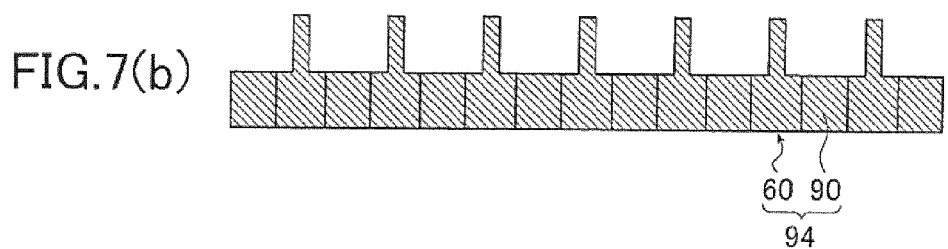

First, a base substrate (a first substrate) 90 made of graphite and having a plurality of through holes 92 (second through holes) formed in the surface is fabricated (FIG. 7(a)). The base substrate 90 is a graphite substrate having a thickness of say 10 mm. A plurality of through holes 92 each having a diameter of say 0.8 mm are formed by mechanical machining in given positions of the base substrate 90. Each through hole 92 has a shape matching the base portion 62 of the columnar members 60.

A plurality of columnar members 60 made of graphite are disposed in the through holes 92 of the base substrate 90 (FIG. 78). The columnar members 60 may be disposed by the same method as illustrated in FIG. 4B. The columnar members 60 are disposed in the base substrate 90 with the base portions 62 of the columnar members 60 fitted in the through holes 92. With the columnar members 60 thus disposed, a graphite assembly 94 is configured wherein the convex portions 64 of the columnar members 60 project from the surface of the base substrate 90. Where necessary, an adhesive or a known hardening resin may be used to secure the base portions 60 of the columnar members 60 to the reference holes 52.

Figure 7C:
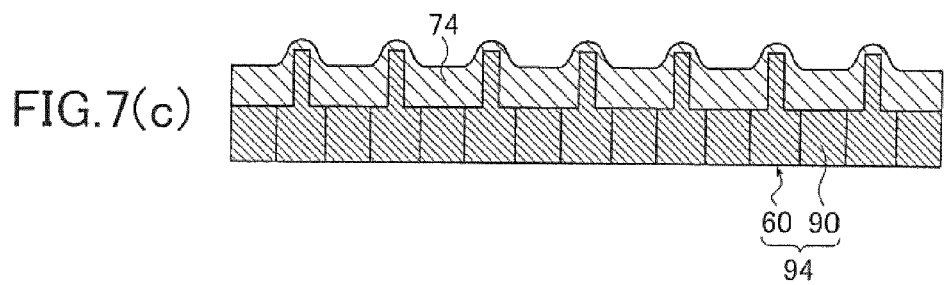

Next, the graphite assembly 94 having the convex portions 64 projecting therefrom are introduced into a known CVD device to form a cover layer 74 made of CVD-SiC over the surface of the graphite assembly 94 (FIG. 7C). The CVD method provides a preferable step coverage on the relief surface of the substrate to be filmed. The cover layer 74 covers the whole surface of the graphite assembly 94 including the convex portions 64 projecting from the surface of the base substrate 90. As with the method illustrated in FIG. 4C, the cover layer 74 is formed so that the film thickness of the cover layer 74 from the surface of the base substrate 90 to the surface of the cover layer 74 is not less than the set film thickness of the electrode surface layer (layer formed of a CVD-SiC layer) of the upper electrode as finally formed.

Figure 7D:
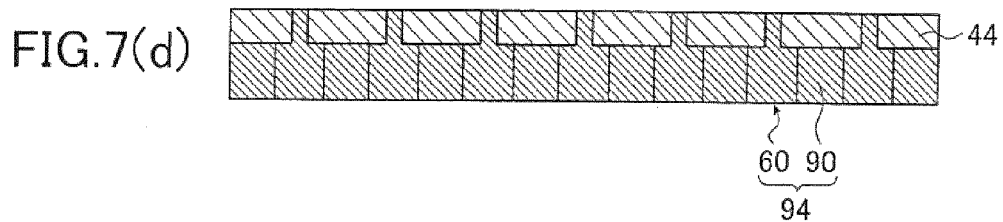

Next, the cover layer 74 placed over the surface of the graphite assembly 94 is planarized. This reduces the thickness of the cover layer 74 to the set film thickness of the electrode surface layer (formed of a CVD-SiC layer) of the upper electrode as finally formed to form the electrode surface layer 44 made of a CVD-SiC layer with the top end of the convex portions 64 exposed at the surface (FIG. 7D).

Figure 7E:
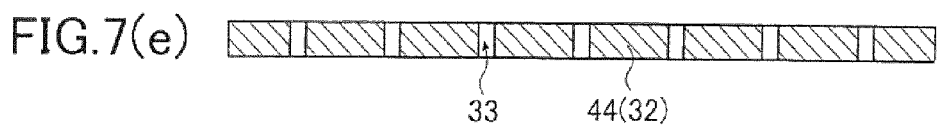

Next, the graphite assembly 94 having the electrode surface layer 44 formed thereon is disposed in an oxidizing atmosphere for heating to decompose and remove the whole graphite assembly 94 made of graphite by oxidation (FIG. 7E). The graphite assembly 94 may be decomposed and removed by the same method as the method illustrated in FIG. 4E whereby the columnar members 60 are decomposed and removed. Using the method of producing an electrode for a plasma processing apparatus according to the present invention enables formation of the electrode 32 in the form of a substrate formed solely of a CVD-SiC layer provided with gas supply holes having such a small diameter of say 0.1 mm that cannot be achieved by mechanical machining or ultrasonic machining.

Using the method of producing an electrode for a plasma processing apparatus according to the present invention, an electrode, of which the substrate has a reduced thickness because the surface was corroded by plasma, can be restored to its original state at relatively low costs even in the case of a substrate-like electrode formed solely of the CVD-SiC layer. Specifically, the thickness of the electrode surface layer of an electrode, of which the substrate has a reduced thickness because the surface was corroded by plasma, can be restored to its original thickness at relatively low costs.

FIGS. 8(a) to 8(e) are views for explaining another example of the method of restoring an electrode for a plasma processing apparatus according to the invention. In FIGS. 8(a) to 8(e), representing the case of a used electrode substrate 96 made solely of CVD-SiC, of which the substrate, after the electrode was previously installed in the plasma processing apparatus and used for generation of plasma, has been worn and reduced in thickness as compared with when the electrode was installed in a plasma processing apparatus, the thickness of the electrode substrate is recovered to its original thickness. The used electrode substrate 96 subjected to the processing illustrated in FIGS. 8(a) to 8(e) is an upper electrode made solely of CVD-SiC and produced by the method illustrated in FIGS. 7(a) to 7(e); the thickness has been reduced as compared with when the electrode was manufactured through exposure to plasma after the electrode was previously installed in the device 10. For example, the thickness of the used electrode substrate 96, which measured 4.0 mm upon completion of its manufacture (at the time of its installation in the device 10), has decreased to, say, 3.0 mm through repeated exposure to plasma.

Figure 8A:
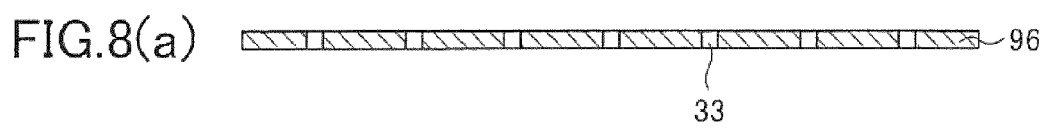
FIGS. 8(a) to 8(e) These are views for explaining another example of a method of restoring an electrode for a plasma processing apparatus using the method of producing an electrode for a plasma processing apparatus according to the invention.
Figure 8B:
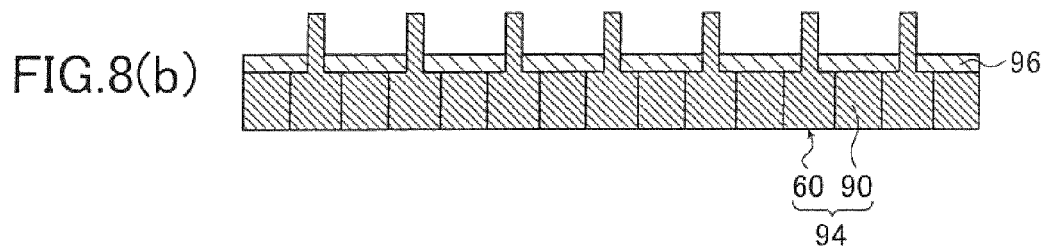

First, the graphite assembly 94 formed of the base substrate (second substrate) 90 and the columnar members 60 are fitted to the gas emission holes 33 provided in the used electrode substrate 96 as illustrated in FIG. 8(a). More specifically, the base substrate 90 having the same configuration as the base layer (first substrate) 42 having the reference holes 52 is fabricated, and the columnar members 60 forming a part of the graphite assembly 94 are fitted into the reference holes of the base substrate 90 and the gas emission holes 33 of the used electrode substrate 96. (FIG. 8(b)). The gas emission holes 33 of the used electrode substrate 96 are made using the columnar members 60 so that the gas emission holes 33 each have a shape matching the shape of the convex portion 64 of the columnar members 60. The above columnar members 60 made of graphite can be easily fitted and disposed in the gas emission holes 33 provided in the used electrode substrate 96.

Figure 8C:
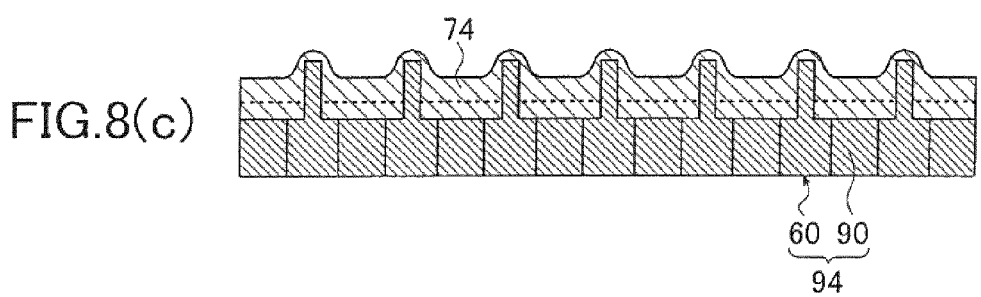

Next, the substrate in this state is introduced into a known CVD device to form the cover layer 74 made of CVD-SiC over the surface of the used electrode substrate 96 of which the thickness has decreased (FIG. 8C). As in the case illustrated in FIG. 6C, the cover layer 74 is formed so that the film thickness from the surface portion of the base layer 92 to the uppermost surface is not less than the set film thickness of the electrode surface layer (layer formed of a CVD-SiC layer) of the upper electrode as finally formed. In this embodiment, the cover layer 79 is formed so that the film thickness $H_3$ of a portion corresponding to the surface portion of the used electrode substrate 96 is 4.0 mm.

Figure 8D:
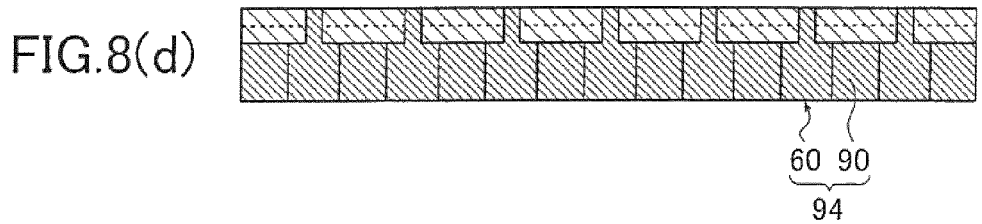
Figure 8E:
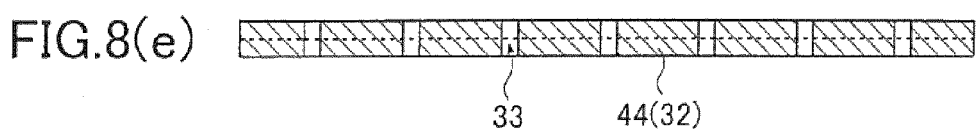

Then, as illustrated in FIG. 8D, the cover layer 74 thus formed is planarized by the same method as illustrated in FIG. 6D to reduce the thickness of the cover layer 74 to the set film thickness of the electrode surface layer (formed of a CVD-SiC layer) of the upper electrode as finally formed. Thus, the top ends of the convex portions 64 are exposed at the surface (FIG. 8D). The substrate in this state is disposed in an oxidizing atmosphere for heating to decompose and remove the graphite assembly 94 made of graphite (FIG. 8E). Use of the restoration method illustrated in FIGS. 8(a) to 8(e) permits recovering the thickness of the electrode surface layer 94 of the used electrode substrate 96, of which the thickness of the electrode surface layer 44 has been reduced as compared with when the electrode was installed in a plasma processing apparatus through its use for generation of plasma in the plasma processing apparatus after the electrode was previously installed in the plasma processing apparatus, to its original thickness.

Figure 9A:
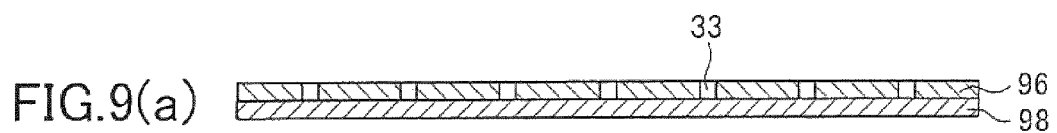
FIGS. 9(a) to 9(c) These are views for explaining another example of the method of restoring an electrode for a plasma processing apparatus according to the invention.
Figure 9B:
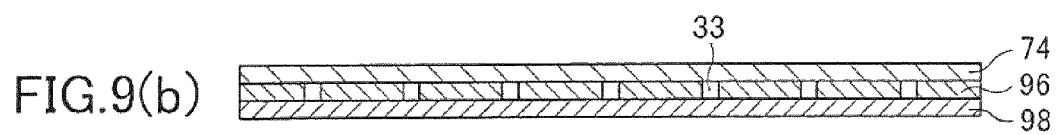
Figure 9C:
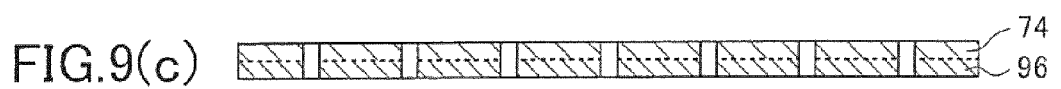

Further, the present invention also permits a restoration method as illustrated in FIGS. 9(a) to 9(c). In lieu of the method illustrated in FIG. 8B using the graphite assembly 94 formed of the base substrate 90 and the columnar members 60 whereby the columnar members 60 are fitted into the reference holes of the used electrode substrate 96, a mask layer 98 as illustrated in FIG. 9(a) is formed on the surface opposite from the surface on which the cover layer 74 is to be provided so that the mask layer 98 closes the openings of the reference holes located opposite therefrom.

Then, the cover layer 74 made of CVD-SiC is formed so that the film thickness of the used electrode substrate 96 is not less than a set film thickness (FIG. 9B). In the process, the cover layer 74 is not formed in the reference holes. Then, the cover layer 74 thus formed is planarized in the same manner as in FIG. 8D to reduce the thickness of the cover layer 74 to the set film thickness of the electrode surface layer (formed of a CVD-SiC layer) of the upper electrode as finally formed. Further, the mask layer 98 is removed, and the reference holes that remain after the removal of the mask layer 98 are used to re-establish them using such a method as mechanical machining or ultrasonic machining so the reference holes penetrate the substrate (FIG. 9C).

Since the existing reference holes remain in the substrate surface on the side on which the mask layer 98 was formed and then removed, the reference holes through the cover layer 74 can be easily formed by tracing those remaining reference holes. Thus, formation of the reference holes can be less costly as compared with a case where the reference holes are formed from the beginning while the accuracy of the holes can be maintained.

As described above, use of the inventive method of producing an electrode for a plasma processing apparatus permits producing an electrode for a plasma processing apparatus comprising a plurality of gas emission holes and capable of sufficiently preventing occurrence of particles during plasma processing at sufficiently low costs. For example, to form a plurality of through holes having an extremely small diameter of 0.5 mm or less at a time in a large number in a substrate-like electrode having a surface formed of a CVD-SiC layer, mechanical machining would require much work while lowering machining accuracies by producing, for example, an error in the diameter of the holes. Although one may use a method such as ultrasonic machining capable of higher accuracies than mechanical machining but then the manufacturing cost in the case of ultrasonic machining, for example, amounted to about 50% of that required for mechanical machining. In comparison with those manufacturing methods, a plurality of through holes having an extremely small diameter of 0.5 mm or less can be formed at, a time in a large number by using the inventive method of producing an electrode for a plasma processing apparatus at a significantly low manufacturing cost of about 20% of that required in, for example, a mechanical machining. In addition, even minute through holes having a diameter of 0.1 mm or less that were impossible to achieve using mechanical machining or ultrasonic machining can be formed with high accuracies using the inventive method of producing an electrode for a plasma processing apparatus.

Further, because of the mechanism, when using mechanical machining or ultrasonic machining, the smaller the diameter of the holes to be formed, the greater the chances of causing scratches in the inner wall surface of holes and allowing fine cutting chips to remain on the substrate. When plasma processing is performed in a plasma processing apparatus by using an electrode provided with gas emission holes having such cutting chips and machining scratches, particles occur in a relatively large number during plasma processing because of these machining scratches and cutting chips. In the inventive method of producing an electrode for a plasma processing apparatus, previously fabricated columnar members having a smooth surface are used to achieve formation of an electrode for a plasma processing apparatus comprising gas emission holes composed of through holes having an inner shape matching the external shape of these columnar members. When using an electrode for a plasma processing apparatus produced according to the inventive production method, unnecessary particles do not occur during plasma processing.

The electrode for a plasma processing apparatus produced according to the inventive method of producing an electrode for a plasma processing apparatus has a sufficiently high resistance to corrosion in the case where the electrode is exposed to plasma, and ensures stable generation of plasma over an extended period of time. Further, even when the thickness of the substrate has been reduced by corrosion of the electrode surface caused by plasma, use of the inventive method of producing an electrode for a plasma processing apparatus permits restoration to the original thickness of the substrate with a plurality of gas emission holes provided at a relatively low cost. In other words, use of the inventive method of producing an electrode used for a plasma processing apparatus permits reducing the running costs of the plasma processing apparatus.

In the above embodiments of electrode used for a plasma processing apparatus produced by the inventive method of producing an electrode for a plasma processing apparatus, the electrode surface layer exposed to generated plasma is made of CVD-SiC by way of example. In the electrode for a plasma processing apparatus produced by the inventive method of producing an electrode for a plasma processing apparatus, the material (second material) of which the electrode surface layer exposed to generated plasma is made need not necessarily be CVD-SiC. For example, it may be $Y_2O_3$, $Al_2O_3$, or AlN. The first material and the material of the columnar members are also not limited and may be any of various known materials as appropriate.

Further, the method of removing the columnar members is not limited to decomposition by oxidation of the columnar members. For example, only the columnar members may be limitatively dissolved and removed by immersing them in a chemical. For example, the combination of the first material and the material of the columnar members and the method of removing the columnar members may be determined as appropriate so that only the columnar members can be removed, with the first material and the second material allowed to remain.

While the method of producing an electrode for a plasma processing apparatus and the method of restoring the same according to the invention have been described above, the method of producing an electrode for a plasma processing apparatus is not limited to the above embodiments, and various modifications may be made without departing from the spirit and scope of the invention.

The invention claimed is:

1. A method of producing an electrode for a plasma processing apparatus, said electrode being provided with gas emission holes and installed in a plasma processing apparatus used to generate plasma in a plasma generation container by application of high frequency voltage, comprising:
   a step of forming reference holes in a surface of a first substrate made of a first material;
   a step of fitting columnar members in said reference holes, respectively, and disposing said columnar members in said first substrate in such a manner that at least a part of each of said columnar members projects from said surface of said first substrate;
   a step of forming an electrode surface layer made of a second material on said surface of said first substrate in such a manner that an end portion of each of said columnar members is exposed at a surface thereof; and
   a step of removing at least said columnar members to obtain, as said electrode, a substrate provided with first through holes each having a cross section matching a sectional shape of a projecting portion of each of said columnar members in said electrode surface layer and an inner diameter smaller than an inner diameter of each of said reference holes.

2. The method of producing an electrode for a plasma processing apparatus according to claim 1,
   wherein said columnar members each have a base portion and a convex portion and said base portion has a sectional shape substantially matching a sectional shape of said reference holes, and wherein said convex portion is said projecting portion projecting from said surface of said first substrate when disposed in said first substrate and has a sectional area smaller than a sectional area of said base portion.

3. The method of producing an electrode for a plasma processing apparatus according to claim 1, wherein the step of forming said electrode surface layer comprises coating using said second material so as to entirely cover said projecting portion of said columnar members projecting from said surface of said first substrate and thereafter machining a surface of said second material to expose said end portions of said columnar members to form said electrode surface layer.

4. The method of producing an electrode for a plasma processing apparatus according to claim 1,
   wherein said reference holes are through holes piercing said first substrate, wherein said electrode has a configuration comprising said first substrate including said reference holes and said electrode surface layer formed with said first through holes,
   wherein said gas emission holes provided in said electrode are holes formed by said reference holes communicating with said first through holes, and
   wherein the step of obtaining said electrode comprises removing only said columnar members to obtain said electrode.

5. The method of producing an electrode for a plasma processing apparatus according to claim 4, wherein the step of forming said electrode surface layer comprises performing a CVD film formation step on said surface of said first substrate to form a layer made of CVD-SiC as said electrode surface layer.

6. The method of producing an electrode for a plasma processing apparatus according to claim 4, wherein said first material is sintered SiC.

7. The method of producing an electrode for a plasma processing apparatus according to claim 4, wherein said columnar members are made of graphite or carbon.

8. The method of producing an electrode for a plasma processing apparatus according to claim 7, wherein when removing said columnar members, said columnar members are oxidized by heating in an atmosphere containing oxygen to decompose and remove said columnar members.

9. The method of producing an electrode for a plasma processing apparatus according to claim 8, wherein said first substrate and said columnar members are both made of graphite or carbon.

10. The method of producing an electrode for a plasma processing apparatus according to claim 9, wherein when removing said columnar members, said first substrate and said columnar members are oxidized by heating in an atmosphere containing oxygen to decompose and remove said first substrate and said columnar members.

11. The method of producing an electrode for a plasma processing apparatus according to claim 1,
   wherein said electrode is composed solely of said electrode surface layer, and
   wherein the step of obtaining said electrode comprises removing said first substrate together with said columnar members to obtain said electrode.

12. The method of producing an electrode for a plasma processing apparatus according to claim 11, wherein the step of forming said electrode surface layer comprises performing a CVD film formation step on said surface of said first substrate to form a layer made of CVD-SiC as said electrode surface layer.

13. The method of producing an electrode for a plasma processing apparatus according to claim 1, wherein a cross section of said base portion smoothly communicates with a cross section of said convex portion of said columnar members without forming any step between them.

14. A method of restoring a worn electrode provided with gas emission holes and having a thickness reduced through use for generation of plasma in a plasma generation container,
   wherein said electrode is produced by a production method comprising:
   a step of forming reference holes in a surface of a first substrate made of a first material;
   a step of fitting columnar members in said reference holes, respectively, and disposing said columnar members in said first substrate in such a manner that at least a part of each of said columnar members projects from said surface of said first substrate;
   a step of forming an electrode surface layer made of a second material on said surface of said first substrate in such a manner that an end portion of each of said columnar members are exposed at a surface thereof; and a step of removing at least said columnar members to obtain, as said electrode, a substrate provided with first through holes each having a cross section matching a sectional shape of a projecting portion of each of said columnar members in said electrode surface layer, and wherein, when restoring said worn electrode, said restoring method comprises:

a step of fitting said columnar members in said reference holes or said first through holes of said electrode or both;

a step of coating said surface of said electrode surface layer of said electrode fitted with said columnar members with said second material to increase a thickness of said electrode surface layer; and a step of removing at least said fitted columnar members.

15. The method of restoring a worn electrode according to claim 14, wherein said electrode produced by said production method has a configuration comprising said first substrate including said reference holes and said electrode surface layer formed with said first through holes, and wherein, when said columnar members are fitted in said reference holes and said first through holes and said columnar members are removed to restore said electrode, said columnar members are removed and said first substrate and said electrode surface layer are allowed to remain.

16. The method of restoring a worn electrode according to claim 14, wherein said electrode produced by said production method is configured by said electrode surface layer formed with said first through holes, and wherein, when restoring said electrode, said restoring method comprises:

preparing a second substrate having the same configuration as said first substrate comprising said reference holes;

fitting said columnar members in said reference holes of said substrate and said first through holes of said electrode; and removing said columnar members and said second substrate.

17. A method of restoring a worn electrode provided with gas emission holes and having a thickness reduced through use for generation of plasma in a plasma generation container, wherein said electrode is produced by a production method comprising:

a step of forming reference holes in a surface of a first substrate made of a first material;

a step of fitting columnar members in said reference holes, respectively, and disposing said columnar members in said first substrate in such a manner that at least a part of each of said columnar members projects from said surface of said first substrate;

a step of forming an electrode surface layer made of a second material on said surface of said first substrate in such a manner that an end portion of each of said columnar members are exposed at a surface thereof; and a step of removing at least said columnar members to obtain, as said electrode, a substrate provided with first through holes each having a cross section matching a sectional shape of a projecting portion of each of said columnar members in said electrode surface layer, and wherein, when restoring said worn electrode, said restoring method comprises:

a step of forming a mask layer on one surface of said electrode to close openings of said reference holes of said electrode;

a step of coating another surface of said electrode surface layer of said electrode formed with said mask layer with said second material to increase a thickness of said electrode surface layer; and a step of removing said mask layer and forming said reference holes in a portion by which said electrode surface layer has increased using said reference holes left in said one surface after increasing said thickness of said electrode surface layer.

* * * * *